US005491364A

United States Patent [19]
Brandenburg et al.

[11] Patent Number: 5,491,364
[45] Date of Patent: Feb. 13, 1996

[54] REDUCED STRESS TERMINAL PATTERN FOR INTEGRATED CIRCUIT DEVICES AND PACKAGES

[75] Inventors: Scott D. Brandenburg; William S. Murphy, both of Kokomo; Ahmer R. Syed, Carmel; David A. King, Kokomo, all of Ind.; Shing Yeh, Buffalo Grove, Ill.

[73] Assignee: Delco Electronics Corporation, Kokomo, Ind.

[21] Appl. No.: 299,924

[22] Filed: Aug. 31, 1994

[51] Int. Cl.⁶ .................................................. H01L 23/50
[52] U.S. Cl. ............................ 257/786; 257/779; 257/666
[58] Field of Search .................................... 257/786, 779, 257/666

[56] References Cited

U.S. PATENT DOCUMENTS 3,795,845  3/1974  Cass et al. ............................. 257/786

FOREIGN PATENT DOCUMENTS 0199561  7/1992  Japan ..................................... 257/666

Primary Examiner—Robert P. Limanek
Assistant Examiner—Alexander Oscar Williams
Attorney, Agent, or Firm—Jimmy L. Funke

[57] ABSTRACT

A terminal pattern is provided for an integrated circuit device, such as a ball grid array package or an integrated circuit flip chip. The terminal pattern is composed of a number of terminals arranged in concentric arrays, each array having a substantially circular shape and being composed of a number of terminals. The terminal pattern is composed of at least two arrays, and more typically three or more arrays. When the integrated circuit device is mounted to its intended substrate, the individual terminals of the terminal pattern each register with and are soldered to a corresponding conductor of a conductor pattern formed on the substrate. A significant advantage is that, due to the terminals of the terminal pattern being arranged in concentric arrays, a smaller maximum width for the terminal pattern is achieved than possible with a conventional rectangular terminal pattern having the same number of terminals. As such, the terminal pattern and the resulting solder joints between the terminal pattern and its corresponding conductor pattern exhibit improved fatigue life as compared to the conventional rectangular terminal pattern.

17 Claims, 3 Drawing Sheets

REDUCED STRESS TERMINAL PATTERN FOR INTEGRATED CIRCUIT DEVICES AND PACKAGES

The present invention generally relates to terminals, such as solder bumps and pads, used to secure and electrically interconnect an integrated circuit (IC) chip to a circuit board, such as a ceramic substrate or printed wiring board. More particularly, this invention relates to a terminal pattern composed of a number of such terminals, in which the terminal pattern is patterned in a manner which reduces stresses in the solder joints formed by the terminals, and therefore increases the fatigue life of the terminals and its associated IC chip.

BACKGROUND OF THE INVENTION

Integrated circuit (IC) chips are often soldered to conductor patterns formed on a circuit board, which may be a ceramic substrate or printed wiring board, in a manner which both secures and electrically interconnects the integrated circuit chip to the circuit board. Terminals are formed on the lower surface of the IC chip such that, when the chip is registered with the conductor pattern, each terminal will individually register with a single conductor of the conductor pattern. A solder reflow technique is then typically used to reflow the terminals and metallurgically bond them to their respective conductors.

Due to the numerous functions performed by integrated circuits, a relatively large number of terminals are required to interconnect the IC chip to the conductor pattern. Furthermore, because the size of an IC chip can be as little as a few millimeters per side, the size and spacing of the terminals and the conductors must be closely controlled in order to properly align and mount an IC chip to the corresponding terminal pattern formed on its circuit board.

A method which is widely practiced by the industry for soldering IC chips to a substrate is the flip-chip bonding process. This process utilizes an integrated circuit flip chip, which is generally a monolithic semiconductor device having bead-like terminals, or solder bumps, provided on one face of the chip. The solder bumps form a bump pattern and serve as interconnects between the IC chip and its corresponding conductor pattern on the substrate to which the flip chip is to be soldered by reflowing the solder bumps.

As an example, a conventional flip chip bump pattern composed of eighty-eight solder bumps is arranged as a rectangular array with a row of twenty-two solder bumps to a side, with each row being adjacent an edge of the flip chip. In this particular example, each bump will have a diameter on the order of about 0.15 millimeter, and be spaced center-to-center about 0.30 millimeter from the nearest adjacent bumps. In order to properly register with the single row, rectangular arrangement of this particular bump pattern, the individual conductors of this flip chip's conductor pattern are also spaced about 0.30 millimeter center-to-center, and each will generally have a width on the order of about 0.1 to about 0.2 millimeter.

Because of the close placement of the solder bumps and conductors, the techniques used to pattern the bump and conductor patterns on the surface of the flip chip and to solder the flip chip to its conductor pattern require a significant degree of precision. The size and composition of the solder bumps must also be closely controlled to achieve the required reliability, bond integrity and electrical characteristics, while concurrently eliminating the potential for electrical shorting between adjacent solder bumps and adjacent conductors.

Another method which is widely practiced by the industry for soldering an IC chip to its substrate involves the use of a ball grid array package 10, such as that illustrated in FIG. 1. The ball grid array package 10 utilizes an IC chip 12 which is wire bonded to a daughter board 14 with a number of wires 18. The wires 18 are routed through the daughter board 14 to terminals, or pads 16, on the opposite surface of the daughter board 14. Similar to the flip-chip process, the pads 16 form a pad pattern and serve as interconnects between the integrated circuit chip 12 and its corresponding conductor pattern on a substrate.

A conventional pad pattern 20 for a ball grid array package is shown in FIG. 2. As shown, the pad pattern 20 is composed of 144 pads 16 which are arranged in a rectangular array of twelve pads 16 per side. In the example shown, each pad 16 has a diameter on the order of about 0.76 millimeter and is spaced center-to-center about 1.5 millimeters from the nearest adjacent pads 16. The pad pattern 20 is shown with its conductor pattern 22 in FIG. 3. In order to properly register with the pad pattern 20, the individual conductors 24 of the conductor pattern 22 are generally on the order of about 0.15 millimeter in width, and are spaced about 0.3 millimeter center-to-center. As a result, patterning the pads 16 on the surface of the daughter board 14, patterning the conductors 24 on the surface of the substrate to which the daughter board 14 is to be soldered, and soldering the daughter board 14 to the conductor pattern 22 also require a significant degree of precision. As with the flip chip process, the size and composition of the pads 20 must be closely controlled to achieve the required reliability, bond integrity and electrical characteristics, while concurrently eliminating the potential for electrical shorting between adjacent pads 20 and adjacent conductors 24.

However, as dictated by the dimensions and layout of the pad pattern 20 and the limitations of the techniques by which the pad pattern 20 and the conductor pattern 22 are deposited, only the 132 outermost pads 16 of the 144 available pads 16 can be accessed by a single layer conductor pattern. Specifically, additional conductors 24 cannot be routed to the centermost pads 16 because such conductors 24 cannot be accommodated within the already tightly-arranged conductor pattern 22. Accordingly, in order to utilize all of the available pads 16, it has been the practice to use two or more conductor layers, with vias formed between layers to gain access to some of the pads 16. However, this technique undesirably adds complexity and costs to the process.

While presently known techniques used to form the terminal and conductor patterns for flip chip and ball grid array packages are generally sufficient, it would be desirable to improve the fatigue life of the solder joints formed by the terminals with the conductors, and more specifically, the stress induced in the solder joints as a result of temperature effects and differences in coefficients of thermal expansion of the materials used. Notably, the fatigue life of the solder joints is approximately proportional to the distance between the center of the pattern and the outermost terminal. Therefore, reducing the outside maximum dimension of a terminal pattern would result in reduced stresses, and therefore an improved fatigue life. However, as noted above, the minimum size of the terminal patterns for flip chips and ball grid array packages is limited by the necessity to route a sufficient number of conductors to the individual terminals. In turn, the number of conductors which can be successfully routed to the terminals within a single layer conductor pattern is generally limited by the precision with which the conductors can be formed.

Accordingly, what is needed is an improved terminal pattern for integrated circuit devices such as flip chips and ball grid array packages, in which the terminal pattern is uniquely configured so as to accommodate a desired number of conductors, while having a smaller maximum width than a rectangular terminal pattern having the same number of terminals, such that the improved terminal pattern exhibits improved fatigue life as compared to the conventional rectangular terminal pattern.

SUMMARY OF THE INVENTION

It is an object of this invention to provide a terminal pattern composed of terminals for an integrated circuit device, in which the terminal pattern corresponds to a conductor pattern formed on a surface to which the integrated circuit device is to be mounted.

It is a further object of this invention that such a terminal pattern be highly compact so as to maximize the fatigue life of the solder joints formed by the terminal pattern for a given number of terminals, without requiring a decrease in center-to-center spacing between adjacent terminals and between adjacent conductors in comparison to larger terminal patterns having an identical number of terminals.

It is another object of this invention that such a terminal pattern be configured such that each of its terminals can be accessed by a single layer conductor pattern, and therefore without resorting to multiple layer conductor patterns equipped with vias to gain access to some of the terminals.

It is yet another object of this invention that such a terminal pattern be generally applicable to both flip chip processes as well as ball grid array packages.

In accordance with a preferred embodiment of this invention, these and other objects and advantages are accomplished as follows.

According to the present invention, there is provided a terminal pattern for an integrated circuit device. For example, the terminal pattern can be formed on the lower surface of a daughter board of a ball grid array package, or can be formed on the lower surface of an IC flip chip. The terminal pattern is composed of a number of terminals arranged in concentric arrays, each array having a substantially circular shape and being composed of a number of terminals. The terminal pattern is composed of at least two arrays, and more typically three or more arrays. When the IC device is mounted to its intended substrate, the individual terminals of the terminal pattern each register with and are soldered to a corresponding conductor of a conductor pattern formed on the substrate. The individual conductors of the conductor pattern are arranged such that each conductor generally extends radially outward from the center of the conductor pattern, and therefore the terminal pattern.

A significant advantage of the present invention is that, due to the terminals of the terminal pattern being arranged in concentric arrays, the terminal pattern can be formed to have a smaller maximum width than a conventional rectangular terminal pattern having the same number of terminals. As such, the resulting solder joints formed by the terminals with their corresponding conductors exhibit improved fatigue life as compared to the conventional rectangular terminal pattern.

Another advantage of this invention is that the terminal pattern can be highly compact so as to maximize fatigue life, yet without requiring a decrease in center-to-center spacing between adjacent terminals and between adjacent conductors in comparison to larger terminal patterns having an identical number of terminals. Generally, the required spacings between the terminals and between the conductors are not less, and can often be greater than, the spacing possible with the conventional rectangular pad pattern. In addition, the terminal pattern is configured to enable each of its terminals to be readily accessed by a single layer conductor pattern, such that multiple layered conductor patterns are not required to access and fully utilize each of the pattern's terminals. As a result of the above advantages, a conductor pattern suitable for use with the terminal pattern of this invention can be readily formed using known deposition techniques that are not complicated by multiple layer deposition steps.

Other objects and advantages of this invention will be better appreciated from the following detailed description.

BRIEF DESCRIPTION OF THE DRAWINGS

The above and other advantages of this invention will become more apparent from the following description taken in conjunction with the accompanying drawings, in which.

DETAILED DESCRIPTION OF THE INVENTION

Figure 1:
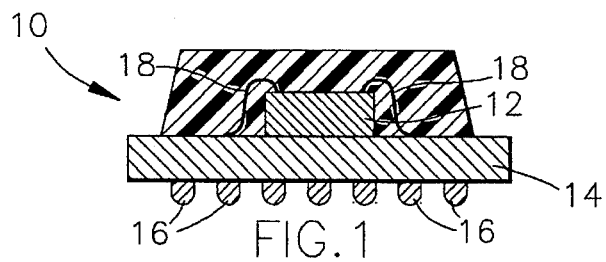
FIG. 1 is a cross-sectional view of a ball grid array package of a type known in the prior art.

A terminal pattern is provided which is suitable for use with integrated circuit devices such as flip chips and ball grid array packages. The terminal pattern is configured to maximize the density of the individual terminals of the terminal pattern, so as to minimize the maximum width of the terminal pattern. Simultaneously, the terminal pattern is configured so as to also maximize the number of conductors which can be routed within a single layer conductor pattern to the terminals of the terminal pattern, while permitting the use of conventional techniques to form the conductors and the terminals.

As noted above, IC devices such as flip chips and ball grid array packages are typically soldered to a conductor pattern which is formed on a suitable circuit board, such as a ceramic substrate or a printed wiring board. Typically, the solder composition used is a paste composed of a tin-lead solder, such as a 63/37 tin-lead alloy, and a binder. The solder composition is deposited onto a surface of the device, such as the lower surface of the daughter board 14 of the ball grid array package 10 of FIG. 1, and then reflowed to form terminals for the device, such as the pads 16 shown in FIG. 1. The terminals are arranged such that they form a terminal pattern which is complimentary to a conductor pattern formed on the circuit board, and such that each terminal will appropriately register with a corresponding conductor of the conductor pattern. While the actual dimensions and spacing for the terminals and conductors may vary widely depending on the particular application, conductor widths of about 0.1 to about 0.3 millimeter and spacing between conductors of about 0.2 to about 0.5 millimeter between centers are typical, and indicative of the tight conductor patterns used in the industry.

Forming such tightly-arranged conductor patterns requires accurate control of the size and location of the terminals on the IC device. Specifically, the deposition process used to form the terminals must ensure that each is formed using an amount of solder which will avoid creating an inadvertent electrical short between adjacent pairs of terminals or conductors, yet will form a reliable and durable solder joint and conduction path between the IC device and its conductor pattern.

In accordance with this invention, enhanced fatigue life and reliability can be achieved for soldered IC devices while utilizing conventional deposition and soldering techniques. Specifically, by reducing the size of the terminal pattern on the IC device, the fatigue life of the device can be increased as a result of lower shear strain within the solder joints formed by the terminals. This relationship is represented by the equation:

$$N_f \propto (L \Delta \alpha \Delta T_e)^{1/c}$$

where $N_f$ is fatigue life in number of cycles, L is the distance between the center of the terminal pattern and the outermost solder joint formed by the outermost terminal, $\Delta \alpha$ is the coefficient of thermal expansion mismatch between the device and the substrate onto which the device is mounted, $\Delta T_e$ is the equivalent cyclic temperature swing, and c is the fatigue ductility exponent which has a range of about −0.4 to about −0.6 for many materials, including solder materials of the type used for microelectronics. From this equation, it can be seen that an improvement in fatigue life $N_f$ could be achieved if the value for L were reduced.

Figure 4:
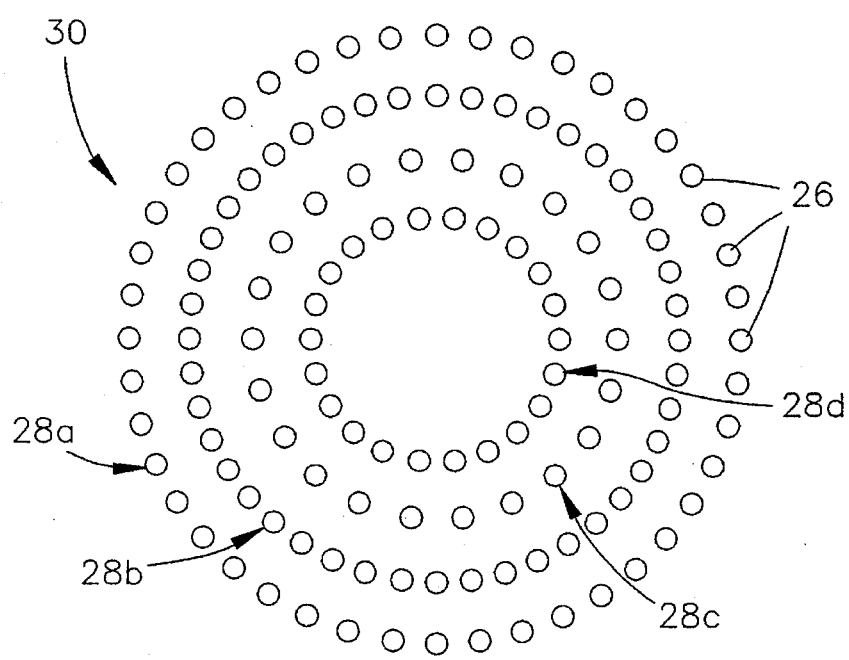
FIG. 4 is a plan view of a concentric pad pattern for use with the ball grid array package of FIG. 1 in accordance with a preferred embodiment of the present invention.

As shown in FIG. 4, a terminal pattern 30 configured in accordance with this invention enables the value L for the terminal pattern 30 of an IC device to be reduced through uniquely arranging the terminals 26 in concentric arrays 28, which in FIG. 4 are identified as arrays 28a through 28d. As illustrated in FIG. 4, 132 individual terminals 26 are provided by the arrays 28, with forty-four terminals 26 being provided by each of the outermost arrays 28a and 28b, and twenty-two terminals 26 being provided by each of the innermost arrays 28c and 28d. As such, a sufficient number of terminals 26 are available to make the terminal pattern 30 of FIG. 4 suitable for use with high pin count devices, such as flip chips and high input/output (I/O) packages which may require 100 terminals or more. An example of the latter is the ball grid array package 10 of FIG. 1.

Figure 2:
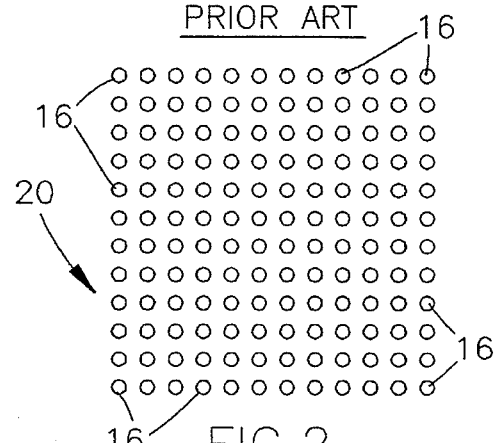
FIG. 2 is a plan view of a rectangular pad pattern of a type used with the ball grid array package of FIG. 1 in accordance with the prior art.
Figure 3:
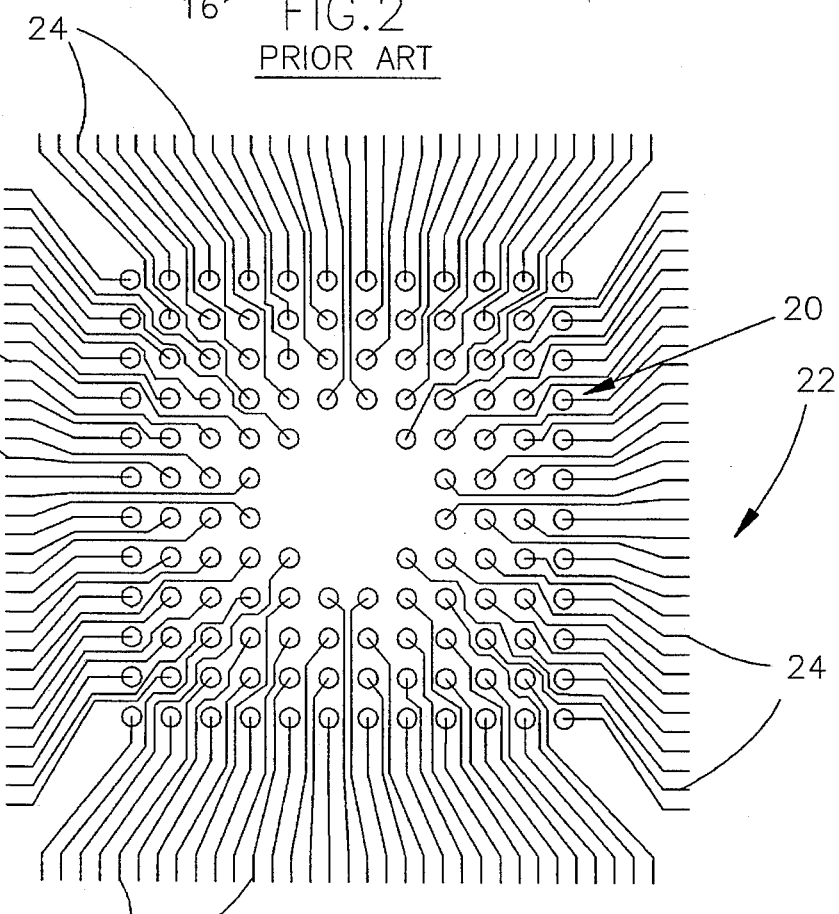
FIG. 3 is plan view of the rectangular pad pattern of FIG. 2, in which the pad pattern is shown registered with a conductor pattern on a substrate to which the ball grid array package is mounted, in accordance with the prior art.
Figure 5:
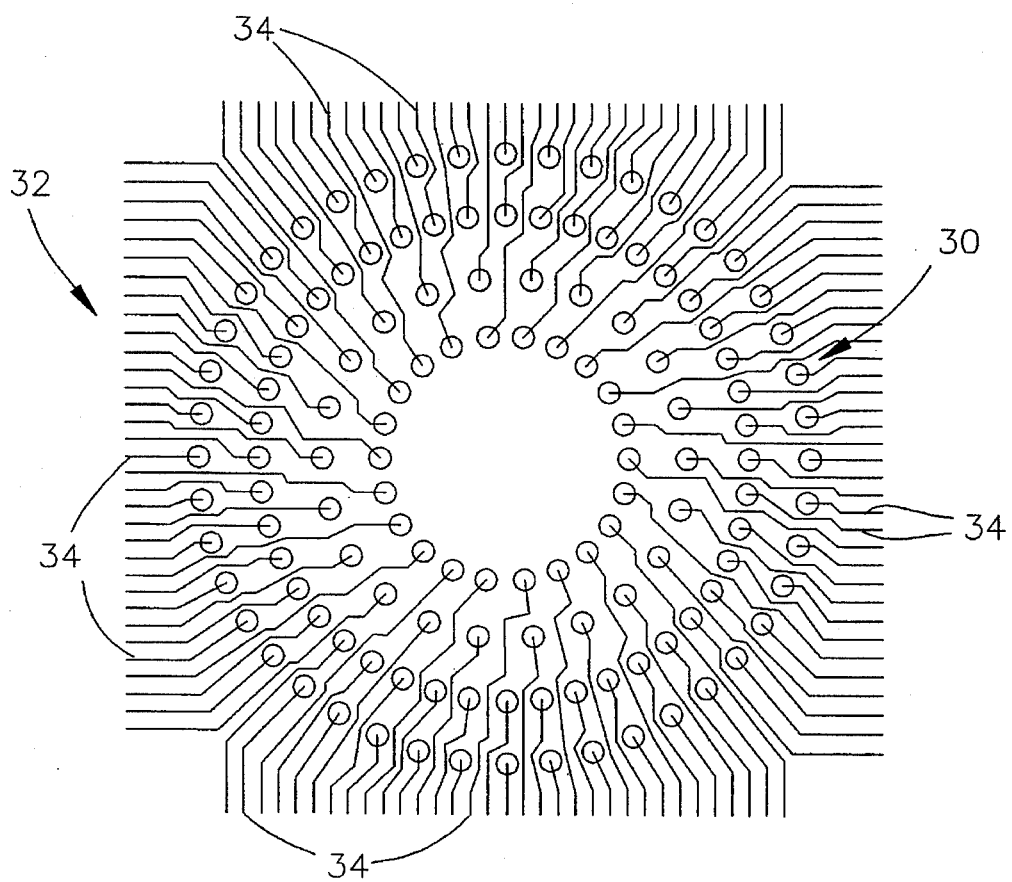
FIG. 5 is a plan view of the concentric pad pattern of FIG. 4, in which the concentric pad pattern is shown registered with a conductor pattern on a substrate to which the ball grid array package is mounted, in accordance wish the preferred embodiment of the present invention.

As a particular feature of this invention, the terminal pattern 30 can be patterned such that the terminal size is on the order of that for prior art terminal patterns, such as the pad pattern 20 for the ball grid array package 10 of FIGS. 2 and 3, or a bump pattern for a flip chip process. For example, using the pad pattern 20 of the ball grid array package 10 of FIG. 1 as a point of reference, each terminal 26 of the terminal pattern 30 can be formed to have a diameter of about 0.76 millimeter, which is the same for the conventional rectangular pad pattern 20. Notably, the center-to-center spacing between adjacent terminals 26 varies, with the spacing between some adjacent pairs of terminals 26 being less than the diameters of the terminals 26. As shown in FIG. 4, the first and third arrays 28a and 28c may be less tightly packed than the second and fourth arrays 28b and 28d, yet the terminal pattern 30 readily accommodates each of the 132 conductors 34, as shown in FIG. 5.

Due to the unique arrangement of the terminal pattern 30, the individual conductors 34 of the conductor pattern 32 can be individually routed to each of the 132 terminals 26 of the terminal pattern 30 of this invention, and yet be generally sized and spaced identically to that of the conductor pattern 22 of FIG. 3. Specifically, the conductors 34 may be formed using conventional deposition techniques to have a width on the order of about 0.15 millimeter, and spaced about 0.3 millimeter center-to-center within a single conductor pattern layer. As a result, use of the terminal pattern 30 of this invention does not entail a more complicated or precise patterning technique for the conductors 34 than that required for the conductor pattern 22 of the prior art, nor does the terminal pattern 30 require a multiple layer conductor pattern with vias to access each of its terminals 26.

Importantly, a significant feature of the concentric terminal pattern 30 of this invention is that, based on the above dimensions for a ball grid array package, an outer diameter of only about 21.4 millimeters can be achieved, as compared to 23.7 millimeters for the rectangular pad pattern 20 of FIG. 2. According to the above fatigue life equation, the terminal pattern 30 of this invention will exhibit a fatigue life of approximately 20 percent to about 30 percent greater than that for the rectangular pad pattern 20. In addition, the terminal pattern 30 of this invention has been determined to more uniformly distribute stresses among the terminals 26, so as to further increase the fatigue life and reliability of the solder joints formed by the terminals 26.

Figure 6:
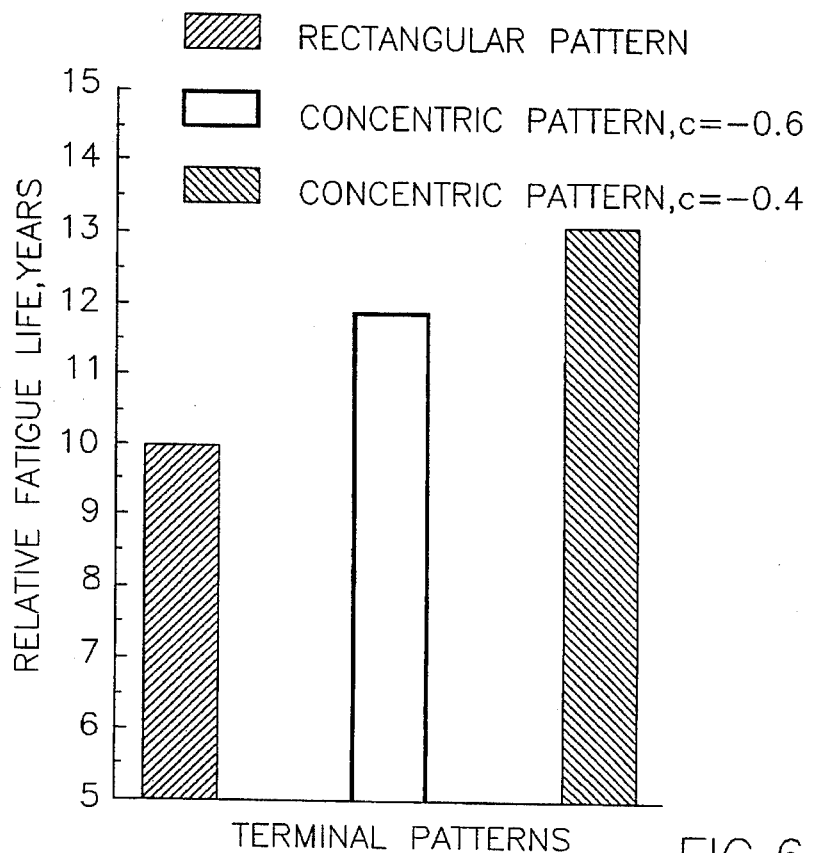
FIGS. 6 and 7 graphically represent the improved fatigue life characteristics of ball grid array packages and flip chips, respectively, which incorporate a concentric pad pattern which is configured in accordance with the teachings of this invention.

FIG. 6 graphically illustrates the theoretical calculated improved fatigue life made possible by the terminal pattern 30 of this invention. Based on the use of identical testing parameters, pad patterns configured in accordance with the rectangular pad pattern 20 of FIGS. 2 and 3 would exhibit a worst case fatigue life on the order of about 10 years, while pad patterns configured in accordance with the concentric terminal pattern 30 of this invention would exhibit a worst case fatigue life on the order of about 12 years when using a fatigue ductility exponent c of −0.6, and about 13 years when using a fatigue ductility exponent c of −0.4.

While the invention has been described above with reference to its use for the ball grid array package 10 of FIG. 1, the teachings of this invention is equally suited for use with flip chips, as noted above, with potentially an even greater increase in fatigue life being possible. Typically, flip chips require fewer terminals than do ball grid array packages. As noted previously, an example of a flip chip application entails the use of eighty-eight terminals 26, or solder bumps, on the lower surface of the chip. As such, the number of concentric arrays 28 for a flip chip application can be reduced to three concentric arrays of terminals 26. In this example, the outermost array would preferably contain thirty-six solder bumps, the innermost array would contain twenty-four solder bumps, and the intermediate array would contain twenty-eight solder bumps. Disregarding the smaller size of a flip chip, a flip chip solder bump pattern configured in accordance with this invention would otherwise have a similar appearance to the terminal pattern 30 shown in FIG. 4.

In addition, due to the flip chip technique, each solder bump can be patterned such that the bump size is on the order of that for prior art rectangular bump patterns for flip chip processes. For example, using the bump pattern of the flip chip described earlier as a point of reference, each solder bump of the concentric terminal pattern 30 of this invention can be formed to have a diameter of about 0.15 millimeter, which is the same for the conventional rectangular flip chip bump pattern. However, the center-to-center spacing between adjacent solder bumps can be increased dramatically with the terminal pattern 30 of this invention. In the present example, center-to-center spacing can be as much as about 0.7 millimeter, as compared to about 0.30 millimeter for the prior art flip chip pad pattern. As a result, patterning the conductors 34 on the surface of a substrate is significantly less complicated and requires no greater precision than that required for flip chip conductor patterns of the prior art.

Figure 7:
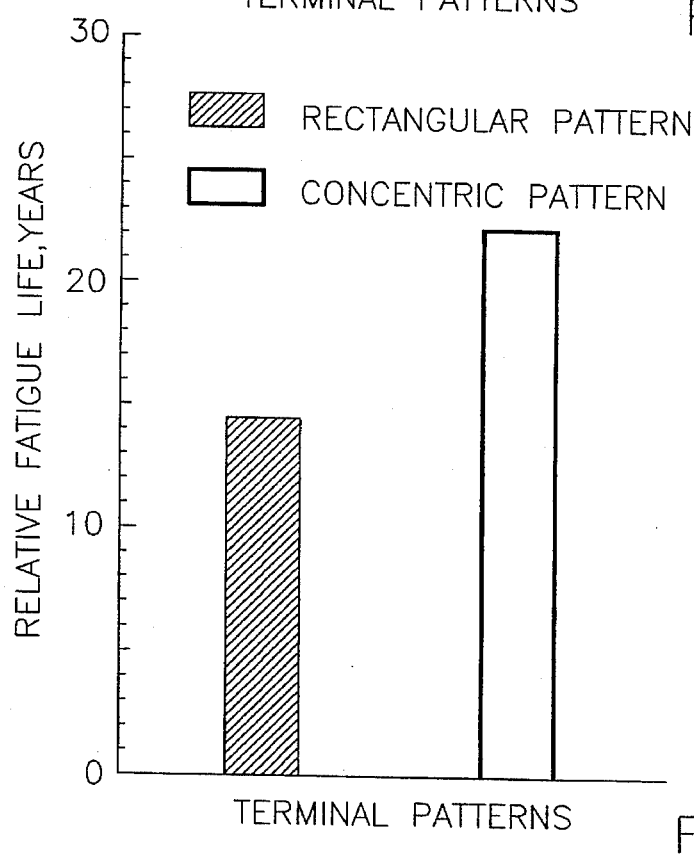

Yet, again using the present example, when configured in accordance with this invention, the diameter of the flip chip pad pattern is a maximum of 3.8 millimeters, as compared to 5.21 millimeters for a rectangular flip chip pad pattern equipped with the same number of terminals. As a result, the solder joints of a flip chip employing the terminal pattern 30 of this invention will exhibit a substantially improved fatigue life over that of the prior art. Theoretically, improvements on the order of about 68 percent to about 120 percent can be expected due to the smaller overall size of the terminal pattern 30, as well as the improved stress distribution effect noted previously, as represented in FIG. 7.

From the above, it can be seen that a significant advantage of this invention is that, due to the terminals of the terminal pattern being arranged in concentric arrays, a significantly smaller maximum width is achieved than that possible with a conventional rectangular terminal pattern having the same number of terminals. As such, the terminal pattern and the resulting solder joints between the terminal pattern and its corresponding conductor pattern exhibit improved fatigue life as compared to the rectangular terminal pattern.

Yet another advantage of this invention is that the required spacing between the conductors of the conductor pattern is not less, and can often be greater than, the spacing allowed with the conventional rectangular terminal pattern. Furthermore, each terminal can be readily accessed by a single layer conductor pattern—i.e., without resorting to a multiple layered conductor pattern. As such, the conductor pattern can be readily formed using known deposition techniques that are not complicated by multiple layer deposition steps.

Finally, the terminal pattern configured in accordance with this invention can be deposited using various techniques which are currently employed in the art. For example, suitable techniques for forming the larger pads for a ball grid array package include stencil printing methods and reflowing solder pin preforms onto the board, while suitable techniques for forming the smaller solder bumps required for a flip chip include plating processes, evaporation processes, stencil techniques, and wave soldering techniques.

While our invention has been described in terms of a preferred embodiment, it is apparent that other forms could be adopted by one skilled in the art. For example, the precise size of the terminals, the size and spacing of the concentric arrays, and the outer dimension of the pad pattern could be modified, or appropriate materials could be substituted for those noted, and the pad pattern could be employed for mounting devices other than those noted. Accordingly, the scope of our invention is to be limited only by the following claims.

The embodiments of the invention in which an exclusive property or privilege is claimed are defined as follows:

1. A terminal pattern for an integrated circuit device, the terminal pattern comprising terminals arranged in concentric arrays, each array having a substantially circular shape and comprising a plurality of the terminals, the plurality of terminals being interconnected with conductors of a single layer conductor pattern such that the conductors extend radially outward relative to the terminal pattern, wherein the terminal pattern has a smaller maximum width than a rectangular terminal pattern for an integrated circuit device having the same number of terminals, whereby after soldering the integrated circuit device to the conductors to form solder joints therebetween with the terminals, the solder joints will exhibit reduced shear strain, resulting in improved fatigue life for the solder joints as compared to that possible for the rectangular terminal pattern.

2. A terminal pattern as recited in claim 1 wherein the terminal pattern is formed on a surface of a daughter board of a ball grid array package.

3. A terminal pattern as recited in claim 1 wherein the terminal pattern is formed on a surface of an integrated circuit flip chip.

4. A terminal pattern as recited in claim 1 wherein each of the conductors has a width of at least about 0.15 millimeter and are spaced at least about 0.3 millimeter apart along the perimeter of the terminal pattern.

5. A terminal pattern as recited in claim 1 wherein the terminal pattern comprises at least two arrays.

6. A terminal pattern for a ball grid array package, the terminal pattern being formed on a surface of a daughter board of the ball grid array package, the terminal pattern comprising terminals arranged in concentric arrays, each array having a substantially circular shape and comprising a plurality of the terminals, the plurality of terminals being interconnected with conductors of a single layer conductor pattern such that the conductors extend radially outward relative to the terminal pattern, wherein the terminal pattern has a smaller maximum width than a rectangular terminal pattern for a ball grid array package having the same number of terminals, whereby after soldering the ball grid array package to the conductors to form solder joints therebetween with the terminals, the solder joints will exhibit reduced shear strain, resulting in improved fatigue life for the solder joints as compared to that possible for the rectangular terminal pattern.

7. A terminal pattern as recited in claim 6 wherein each of the conductors has a width of at least about 0.15 millimeter and are spaced at least about 0.3 millimeter apart along the perimeter of the terminal pattern.

8. A terminal pattern as recited in claim 6 wherein the terminal pattern comprises at least about 100 terminals.

9. A terminal pattern as recited in claim 6 wherein the terminal pattern comprises at least four arrays.

10. A terminal pattern as recited in claim 6 wherein the terminals have substantially equal diameters, and wherein spacing between at least some adjacent pairs of terminals is less than the diameter of the terminals.

11. A terminal pattern as recited in claim 10 wherein the terminals have substantially equal diameters of about 0.76 millimeter.

12. A terminal pattern as recited in claim 6 wherein the terminal pattern has an outer diameter of not more than about 21.4 millimeters.

13. A terminal pattern formed on a surface of an integrated circuit flip chip, the terminal pattern comprising terminals arranged in concentric arrays, each array having a substantially circular shape and comprising a plurality of the terminals, the plurality of terminals being interconnected with conductors of a single layer conductor pattern such that the conductors extend radially outward relative to the terminal pattern, wherein the terminal pattern has a smaller maximum width than a rectangular terminal pattern for an integrated circuit flip chip having the same number of terminals, whereby after soldering the integrated device to the conductors to form solder joints therebetween with the terminals, the solder joints will exhibit reduced shear strain, resulting in improved fatigue life for the solder joints as compared to that possible for the rectangular terminal pattern.

14. A terminal pattern as recited in claim 13 wherein each of the terminals has a diameter of at least about 0.15 millimeter and each adjacent pair of terminals is spaced at least about 0.7 millimeter apart center-to-center.

15. A terminal pattern as recited in claim 13 wherein the terminal pattern comprises at least eighty-eight terminals.

16. A terminal pattern as recited in claim 13 wherein the terminal pattern comprises at least three arrays.

17. A terminal pattern as recited in claim 13 wherein the terminals pattern has an outer diameter of not more than about 3.8 millimeters.

* * * * *